(12) United States Patent
Silvernail (10) Patent No.: US 6,576,351 B2
(45) Date of Patent: Jun. 10, 2003

(54) BARRIER REGION FOR OPTOELECTRONIC DEVICES

(75) Inventor: Jeffrey Alan Silvernail, Yardley, PA (US)

(73) Assignee: Universal Display Corporation, Ewing, NJ (US)

(*) Notice: Subject to any disclaimer, the term of this patent is extended or adjusted under 35 U.S.C. 154(b) by 98 days.

(21) Appl. No.: 09/785,066

(22) Filed: Feb. 16, 2001

(65) Prior Publication Data

US 2002/0113548 A1 Aug. 22, 2002

(51) Int. Cl.$^7$ .......................... H05B 33/00; C09K 11/06
(52) U.S. Cl. .................. 428/690; 428/917; 313/504; 313/506; 313/512; 427/66; 257/100
(58) Field of Search .................. 428/690, 917; 313/506, 512, 509, 504; 427/66; 257/100

(56) References Cited

U.S. PATENT DOCUMENTS

| | | | | |
|---|---|---|---|---|
| 4,357,557 A | | 11/1982 | Inohara et al. ............... 313/509 |
| 4,767,679 A | * | 8/1988 | Kawachi ..................... 428/690 |
| 5,051,654 A | | 9/1991 | Nativi et al. ................. 313/506 |
| 5,189,405 A | * | 2/1993 | Yamashita et al. ........... 340/781 |
| 5,707,745 A | | 1/1998 | Forrest et al. ............... 428/432 |
| 5,757,126 A | | 5/1998 | Harvey, III et al. ......... 313/506 |
| 5,771,562 A | | 6/1998 | Harvey, III et al. ........ 29/592.1 |
| 5,882,761 A | | 3/1999 | Kawami et al. ............... 428/69 |
| 5,952,778 A | | 9/1999 | Haskal et al. ................ 313/504 |
| 5,962,962 A | | 10/1999 | Fujita et al. ................. 313/412 |
| 6,083,313 A | | 7/2000 | Venkatraman et al. . 106/287.14 |
| 6,146,225 A | | 11/2000 | Sheats et al. .................. 445/24 |
| 6,268,695 B1 | * | 7/2001 | Affinito ....................... 313/504 |
| 6,413,645 B1 | * | 7/2002 | Graff et al. .................. 428/446 |
| 2002/0068143 A1 | * | 6/2002 | Silvernail et al. ............ 428/76 |
| 2002/0125484 A1 | * | 9/2002 | Silvernail et al. ............ 257/79 |

FOREIGN PATENT DOCUMENTS

| | | | | |
|---|---|---|---|---|
| EP | 0 977 469 A2 | 2/2000 | ........... H05B/33/04 |
| JP | 07169569 | 7/1995 | ........... H05B/33/04 |
| JP | 09153395 | 6/1997 | ........... H05B/33/22 |
| WO | WO 99/02277 | 1/1999 | ............ B05D/5/12 |
| WO | WO 99/39393 | 8/1999 | ........... H01L/51/20 |
| WO | WO 00/26973 | 5/2000 | ........... H01L/51/20 |
| WO | WO 00/36665 | 6/2000 | ........... H01L/51/20 |
| WO | WO 00/65670 | 11/2000 | ........... H01L/51/20 |
| WO | WO 00/65879 | 11/2000 | ........... H05B/33/12 |
| WO | WO 01/81649 | 11/2001 | ........... C23C/14/08 |

OTHER PUBLICATIONS

A.S. da Silva Sobrinho et al., "Transparent Barrier Coatings on Polyethylene Terephthalate by Single– and Dual–Frequency Plasma–Enhanced Chemical Vapor Deposition," *Journal of Vacuum Science and Technology*, A 16(6), Nov./Dec. 1998, pp 3190–3198.

* cited by examiner

*Primary Examiner*—Cynthia H. Kelly
*Assistant Examiner*—Dawn Garrett
(74) *Attorney, Agent, or Firm*—Mayer Fortkort & Williams, PC; David B. Bonham, Esq (57) ABSTRACT

An organic optoelectronic device structure and a method of making the same. The structure comprises: (a) a first barrier region comprising (i) a first composite layer stack and (ii) a second composite layer stack attached to the first composite layer stack, (b) an organic optoelectronic device selected from an organic light emitting diode, an organic electrochromic display, an organic photovoltaic device and an organic thin film transistor; and (c) at least one additional barrier region, wherein the at least one additional barrier region cooperates with the first barrier region to restrict transmission of water and oxygen to the optoelectronic device from an outer environment. The first composite layer stack in this structure comprises a first polymer substrate layer, at least one first planarizing layer and at least one first high-density layer, while the second composite layer stack similarly comprises a second polymer substrate layer, at least one second planarizing layer and at least one second high-density layer.

42 Claims, 10 Drawing Sheets

BARRIER REGION FOR OPTOELECTRONIC DEVICES

FIELD OF THE INVENTION

The present invention relates to structures that protect organic optoelectronic devices from chemical species in the surrounding environment.

BACKGROUND OF THE INVENTION

Organic optoelectronic devices, including circuits, such as organic light emitting diodes, organic electrochromic displays, organic photovoltaic devices and organic thin film transistors, are known in the art and are becoming increasingly important from an economic standpoint.

As a specific example, organic light emitting devices ("OLEDs"), including both polymer and small-molecule OLEDs, are potential candidates for a great variety of virtual- and direct-view type displays, such as lap-top computers, televisions, digital watches, telephones, pagers, cellular telephones, calculators and the like. Unlike inorganic semiconductor light emitting devices, organic light emitting devices are generally simple and relatively easy and inexpensive to fabricate. Also, OLEDs readily lend themselves to applications requiring a wide variety of colors and to applications that concern large-area devices. In general, two-dimensional OLED arrays for imaging applications are known in the art and are typically composed of a plurality of OLEDs (one or more of which forms a pixel) arranged in rows and columns. Each individual OLED in the array is typically constructed with a first transparent anode (such as ITO), an organic electroluminescent layer on the first electrode, and a metallic cathode on the organic electroluminescent medium. Other OLED architectures are also known in the art such as transparent OLEDs (having a transparent cathode contact), and inverted OLEDs. Substrate materials may include glass, plastic, metal foil, silicon wafers, etc.

In forming an OLED, a layer of reactive metal is typically utilized as the cathode to ensure efficient electron injection and low operating voltages. However, reactive metals and their interface with the organic material are susceptible to oxygen and moisture, which can severely limit the lifetime of the devices. Moisture and oxygen are also known to produce other deleterious effects. For example, moisture and oxygen are known to increase "dark spot areas" in connection with OLEDs.

Components of various other organic optoelectronic devices (e.g., organic electrochromic displays, organic photovoltaic devices and organic thin film transistors) are likewise susceptible to attack from exterior environmental species, including water and oxygen.

BRIEF SUMMARY OF THE INVENTION

The above and other challenges are addressed by the present invention.

According to an embodiment of the present invention, an organic optoelectronic device structure is provided that comprises: (a) a first barrier region comprising (i) a first composite layer stack and (ii) a second composite layer stack attached to the first composite layer stack, (b) an organic optoelectronic device selected from an organic light emitting diode, an organic electrochromic display, an organic photovoltaic device and an organic thin film transistor; and (c) at least one additional barrier region, wherein the at least one additional barrier region cooperates with the first barrier region to restrict transmission of water and oxygen to the optoelectronic device from an outer environment. The first composite layer stack comprises a first polymer substrate layer, at least one first planarizing layer and at least one first high-density layer, while the second composite layer stack comprises a second polymer substrate layer, at least one second planarizing layer and at least one second high-density layer.

The first and second polymer substrate layers can be of the same material composition or different material compositions. Moreover, the first and second high-density layers can be of the same material composition; or at least one of the first and second high-density layers can be of a first material composition, while at least one other of these layers is of a second material composition. Similarly, the first and second planarizing layers can be of the same material composition; or at least one of the first and second planarizing layers can be of a first material composition, while at least one other of these layers is of a second material composition.

In some embodiments, the first and second composite stacks are attached to one another via one of the first and second planarizing layers, while in other embodiments, an adhesive layer is provided between the first and second composite stacks.

Numerous configurations are possible. For example, the at least one first planarizing layer, the at least one first high-density layer, the at least one second planarizing layer and the at least one second high-density layer can be disposed between the first polymer substrate layer and the second polymer substrate layer. As another example, these layers can be arranged such that (i) the at least one first planarizing layer and the at least one first high-density layer are disposed over the first polymer substrate layer, (ii) the second polymer substrate layer is disposed over the at least one first planarizing layer and the at least one first high-density layer, and (iii) the at least one second planarizing layer and the at least one second high-density layer are disposed over the second polymer layer.

Preferably, at least one of the first and second composite layer stacks will comprise two or more planarizing layers and two or more high-density layers. More preferably, at least one of the first and second composite layer stacks will comprise an alternating series of two or more planarizing layers and two or more high-density layers.

Additional composite layer stacks can be provided. For example, the first barrier region can further comprise a third composite layer stack attached to the second composite layer stack, in which case the third composite layer stack comprises a third polymer substrate layer, at least one third planarizing layer and least one third high-density layer.

Preferably, (a) the planarizing layers comprise a material selected from fluorinated polymers, parylenes, cyclotenes and polyacrylates, and (b) the high-density layers comprise a material selected from silicon oxide, silicon nitride, metal oxides (such as aluminum oxide, indium tin oxide and zinc indium tin oxide), metal nitrides, metal carbides, metal oxynitrides. The polymer substrate layers preferably comprise a material selected from a fluorocarbon polymer, a polyethersulphone, a polyimide, a polyolefin (such as a cyclic olefin copolymer), and a polyester (such as polyethylene terephthalate).

The present invention is also directed to methods of forming an organic optoelectronic device structure. According to an embodiment of the invention, a first composite layer stack comprising a first polymer substrate layer, at least one first planarizing layer and at least one first high-density layer is provided. A second composite layer stack comprising a second polymer substrate layer, at least one second planarizing layer and at least one second high-density layer is also provided. The first composite layer stack is attached to the second composite layer stack to form a first barrier region. An organic optoelectronic device selected from an organic light emitting diode, an organic electrochromic display, an organic photovoltaic device and an organic thin film transistor is disposed between the first barrier region and at least one additional barrier region, such that the at least one additional barrier region cooperates with the first barrier region to restrict transmission of water and oxygen to the optoelectronic device from an outer environment.

Preferably, the composite layer stacks in this method are provided by (a) providing a polymer substrate layer, and (b) depositing at least one planarizing layer and at least one high-density layer over the polymer substrate.

One advantage of the present invention is that organic optoelectronic structures are produced that are protected by an effective barrier between the organic optoelectronic device and the ambient atmosphere, reducing the adverse effects of chemical species in the ambient atmosphere, such as moisture and oxygen.

Another advantage of the present invention is that great flexibility in barrier region material selection and design is provided.

These and other embodiments and advantages of the present invention will become readily apparent to those of ordinary skill in the art upon review of the disclosure to follow.

BRIEF DESCRIPTION OF THE DRAWINGS

As is typically the case with such figures, the above are simplified schematic representations, and the actual structures will differ in numerous respects including the relative scale of the components.

DETAILED DESCRIPTION OF THE INVENTION

The present invention will now be described more fully hereinafter with reference to the accompanying drawings in which preferred embodiments of the invention are shown. This invention may, however, be embodied in different forms and should not be construed as limited to the embodiments set forth herein.

As used herein, a "layer" of a given material includes a region of that material whose thickness is small compared to both its length and width. Examples of layers include sheets, foils, films, laminations, coatings, and so forth. As used herein a layer need not be planar, but can be bent, folded or otherwise contoured, for example, to at least partially envelop another component.

Figure 1:
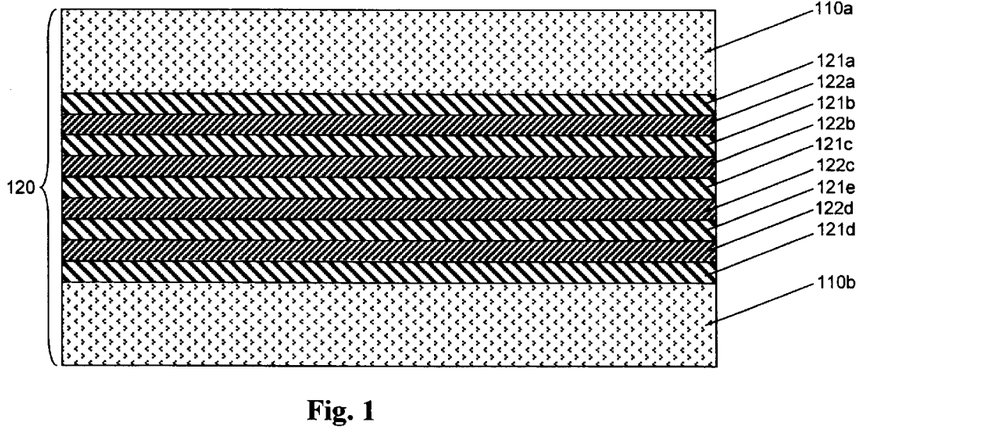
FIG. 1 is a cross-sectional view of a barrier region, according to an embodiment of the invention.

Referring now to FIG. 1, a barrier region 120 is shown in accordance with an embodiment of the invention. The barrier region 120 is typically selected based on the following characteristics: resistance to transport of oxygen, water and any other detrimental molecules from the outside environment, optical characteristics, flexibility and conformability to other surfaces, dimensional stability during processing (e.g., web-based processing), and adequate bonding with other components.

The barrier region includes two polymer substrate layers 110a, 110b. Between the polymer substrate layers 110a, 110b is found a series of alternating cooperative barrier layers, consisting of layers of planarizing material 121a–e and layers of high-density material 122a–d.

Figure 2:
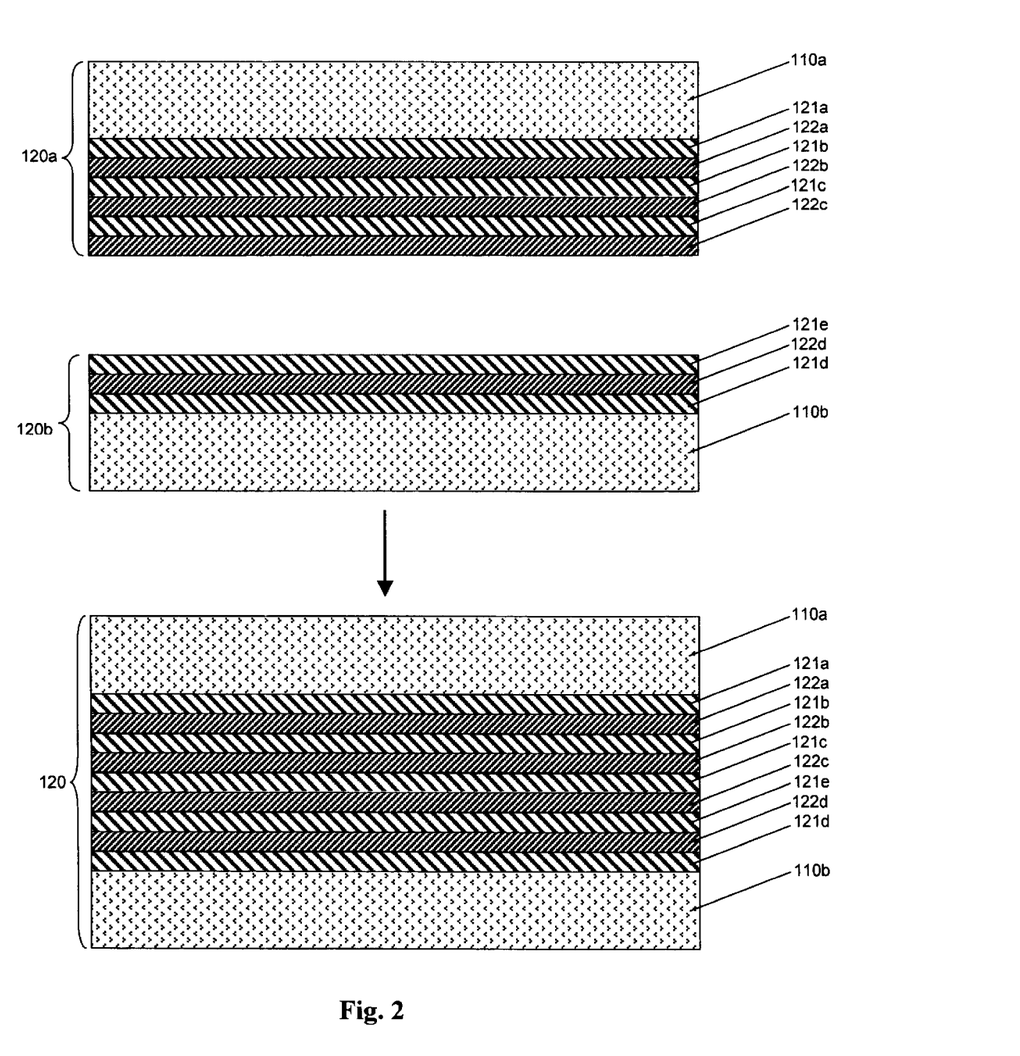
FIG. 2 is a cross-sectional view illustrating how the barrier region of FIG. 1 can be formed from two composite layer stacks, according to an embodiment of the invention.

The barrier region 120 of FIG. 1 is formed from first and second composite layer stacks, each containing the following: a polymer substrate layer, at least one planarizing layer and least one high-density layer. For example, referring to FIG. 2, the first composite layer stack 120a consists of a polymer substrate layer 110a, three planarizing layers 121a–c and three high-density layers 122a–c. The second composite layer stack 120b in this example consists of a polymer substrate layer 110b, two planarizing layers 121d–e and one high-density layer 122d. When assembled as shown in FIG. 2, the first and second composite layer stacks 120a, 120b result in the barrier region of FIG. 1.

The polymer substrate layers are typically selected based on their ability to contribute to the above overall characteristics of the barrier region, and should also be selected for adequate bonding to any adjacent cooperative barrier layer. Preferred materials for the polymer substrate layer include polyolefins, polyesters, polyethersulphones, polyimides and fluorocarbon polymers that are capable of providing a strong adhesive bond with other materials. Preferred polyesters include polyethylene terephthalate. Preferred fluorocarbon polymers that are capable of providing a strong adhesive bond with other materials include Aclar® fluoropolymer available from Honeywell. Preferred polyolefins include Topas® cyclic olefin copolymer available from Ticona, Summit N.J.

In some embodiments of the invention, the polymer substrate layers can have differing material compositions. For example, one of the polymer substrate layers 110a, 110b of FIG. 1 can be selected to provide enhanced resistance to the transmission of moisture, while the other of the polymer substrate layers 110a, 110b can be selected to provide enhanced resistance to oxygen transmission. As a more specific example, the polymer substrate layer 110a can be formed from polyethylene terephthalate, which has good resistance to oxygen transmission, while the polymer substrate layer 110b can be formed from Topas® cyclic olefin copolymer, which has good resistance to moisture transmission.

The polymer substrate layers typically ranges from 25 to 75 microns in thickness.

Like the polymer substrate layers, the cooperative barrier layers (i.e., the planarizing layers and high-density layers) are typically selected based on their ability to contribute to the above overall characteristics of the barrier region. The planarizing layers and high-density layers are preferably provided in an alternating configuration within the barrier region, although other layer arrangements are possible. Preferably, 1 to 10 pairs of these layers, more preferably 3 to 7 pairs, are found in the barrier region. Preferably 1–5, more preferably 1–3 pairs of these layers are used in connection with each composite layer stack used to form the barrier region.

By "planarizing material" is meant a material that forms a smooth planar surface upon application, rather than forming a surface that reflects irregular contours of the underlying surface. Preferred planarizing materials include polymers, such as fluorinated polymers, parylenes, cyclotenes and polyacrylates. Planarizing layers of differing composition can be used within a single barrier region or even within a single composite layer stack. Layers of planarizing materials can be provided using techniques known in the art, for example, by dipping, spin coating, sputtering, evaporative coating, spraying, flash evaporation, chemical vapor deposition and so forth.

By "high-density material" is meant a material with sufficiently close atomic spacing such that diffusion of an outside species, particularly water and oxygen, are hindered. Preferred high-density materials include inorganic materials such as metal oxides, metal nitrides, metal carbides and metal oxynitrides. More preferred are silicon oxides (SiOx), including silicon monoxide (SiO) and silicon dioxide ($SiO_2$), silicon nitrides (typically $Si_3N_4$), silicon oxynitrides, aluminum oxides (typically $Al_2O_3$), indium-tin oxides (ITO) and zinc indium tin oxides. High-density layers of differing composition can be used within a single barrier region or even within a single composite layer stack. Layers of high-density material can be applied using techniques known in the art such as thermal evaporation, sputtering, PECVD methods, electron-beam techniques and so forth.

Examples of multilayer barrier regions comprising layers of both high-density material and layers of planarizing material are disclosed, for example, in U.S. Pat. No. 5,757,126, the entire disclosure of which is hereby incorporated by reference.

Preferably, the barrier regions of the present invention are formed by first providing two or more composite layer stacks, each of which consists of a polymer substrate layer and a desired number of planarizing layers and high-density layers. The composite layer stacks are then combined to form a single barrier region. For example, in FIG. 2 two composite layer stacks 120a, 120b are combined to form the barrier region 120.

A number of techniques are available to combine composite layer stacks into a single barrier region.

In some cases, one of the planarizing or high-density layers within the composite layer stacks can be used for this purpose.

One example is described with reference to FIG. 2. First, layers 121a–c and 122a–c are formed on polymer substrate layer 110a, and layers 121d and 122d are formed on the polymer substrate layer 110b. Subsequently, a precursor of planarizing layer 121e (separate numbering is not provided for the planarizing layer precursor and the planarizing layer in FIG. 2), for example, an uncured liquid monomer layer, is applied to the second composite stack 120b. The first and second composite layer stacks 120a, 120b are then combined as shown, whereupon the precursor layer is cured (for example, by thermal or ultraviolet curing) to form planarizing layer 121e. As a result, the first and second composite stack layers 120a, 120b are adhered to one another to provide the barrier region 120.

In related example, the planarizing layer 121e in the second composite stack 120b can be formed from a thermoplastic material. After combining the first and second composite layer stacks 120a, 120b, the structure is heated under pressure, softening the thermoplastic and bringing it into contact with the first composite stack 120a. Upon cooling, the thermoplastic layer 121e is bonded to layer 122c to form the barrier region 120.

Figure 4:
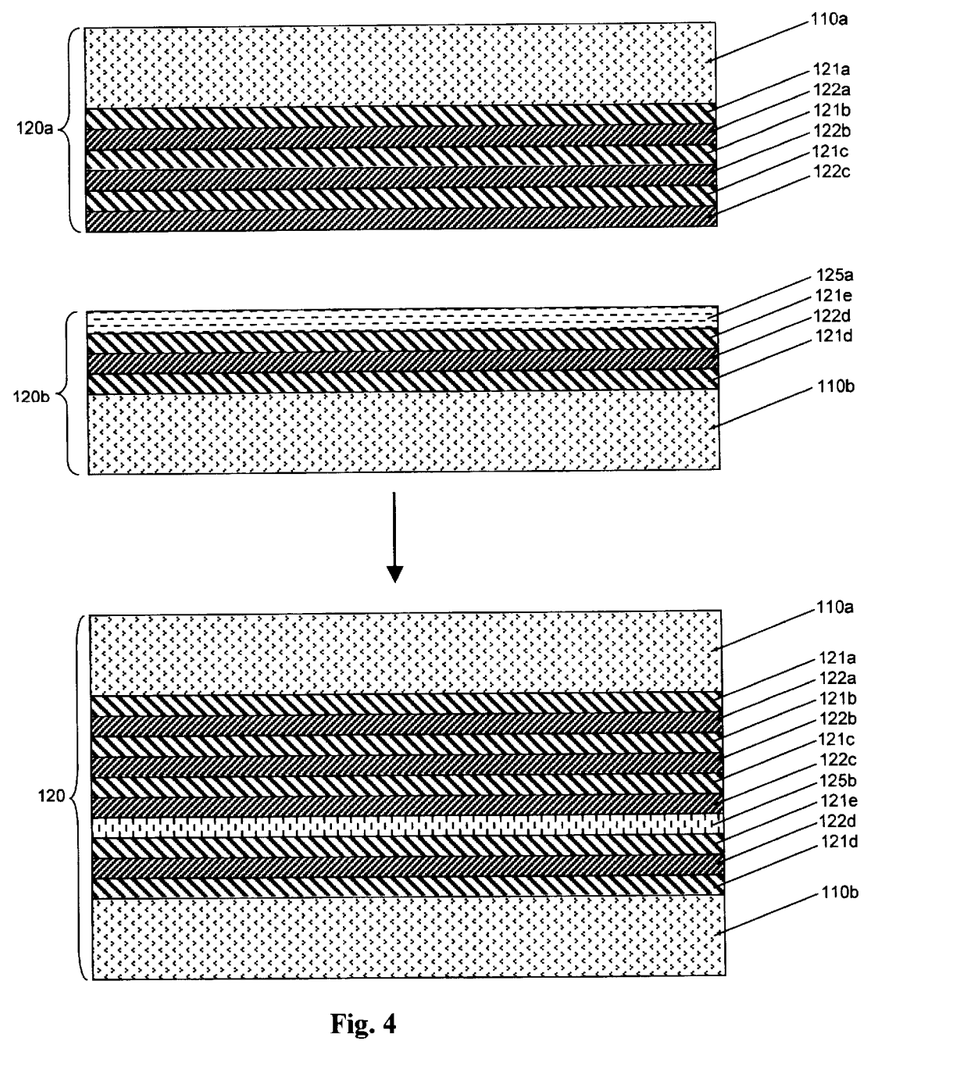
FIG. 4 is a cross-sectional view illustrating how a barrier region can be formed from two composite layer stacks and an adhesive layer, according to an embodiment of the invention.

In other cases, a separate adhesive layer can be utilized. The adhesive layer need not be a planarizing layer (i.e., it need not form a smooth planar surface upon application) so long as the adhesive layer ultimately fills the region between the composite layer stacks during processing. Preferred adhesives are thermally curable adhesives and ultraviolet-curable adhesives. An example of such a technique is illustrated in connection with FIG. 4. First, a first composite layer stack 120a and a second composite layer stack 120b are provided. An uncured adhesive layer 125a is subsequently applied to the second composite layer stack 120b. The first and second composite layer stacks 120a, 120b are then combined and the adhesive layer is cured. The cured adhesive layer 125b adheres the first composite layer stack 120a to the second composite layer stack 120b, forming the barrier region 120.

Figure 3:
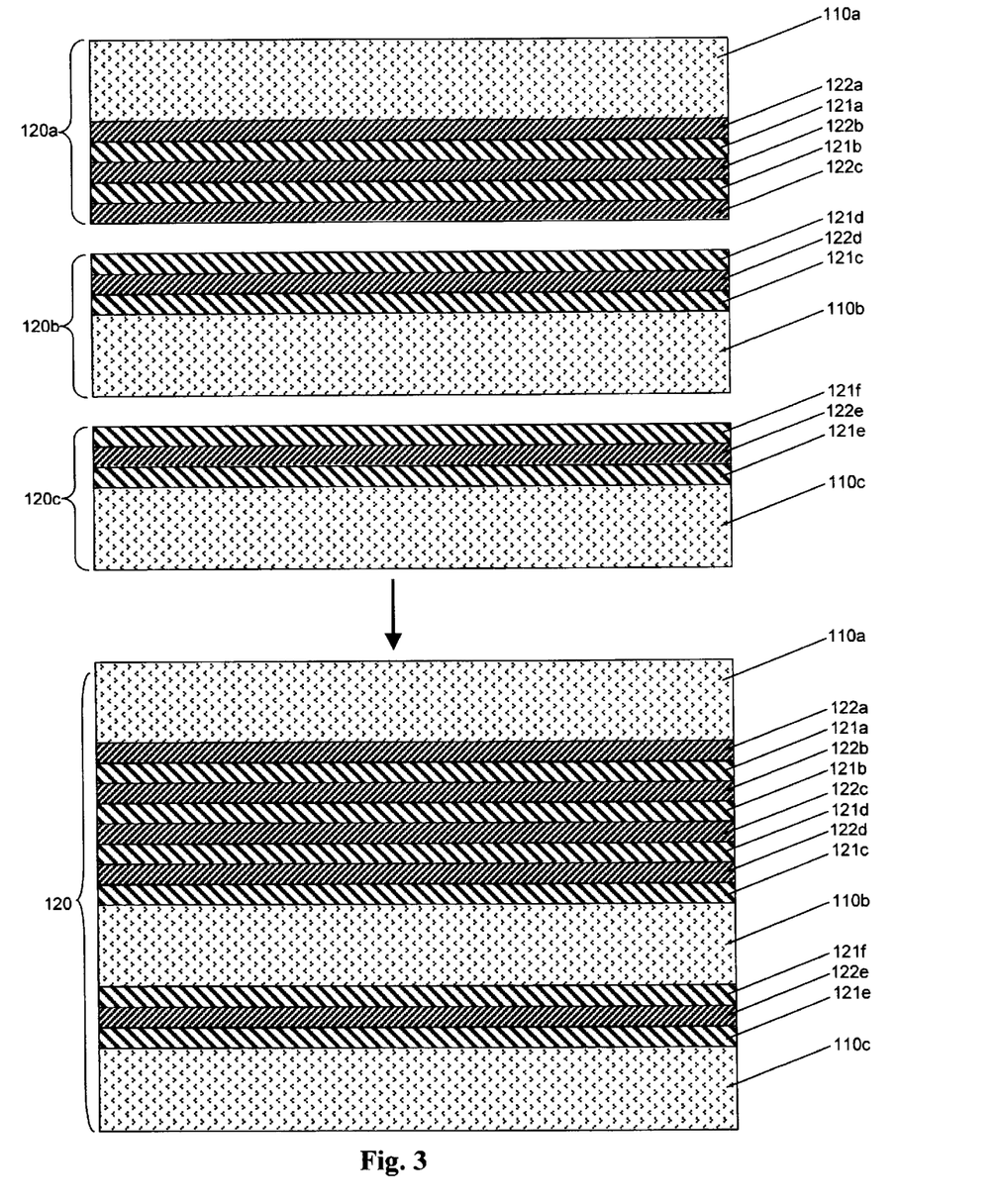
FIG. 3 is a cross-sectional view illustrating how a barrier region can be formed from three composite layer stacks, according to an embodiment of the invention.

Although the above examples involve two composite layer stacks, three, four or even more stacks can be combined in accordance with the present invention. Referring, for example, to FIG. 3, three composite layer stacks are used. A first composite layer stack 120a is provided with planarizing layers 121a,b and high-density layers 122a,b,c. A second composite layer stack 120b is provided with planarizing layers 121c,d and high-density layer 122d. A third composite layer stack 120c is provided with planarizing layers 121e,f and high-density layer 122e. When the first, second and third composite layer stacks 120a,b,c are combined (for example. by curing planarizing layers 121d,f after assembly as discussed above), a barrier region 120 is formed.

Figure 5:
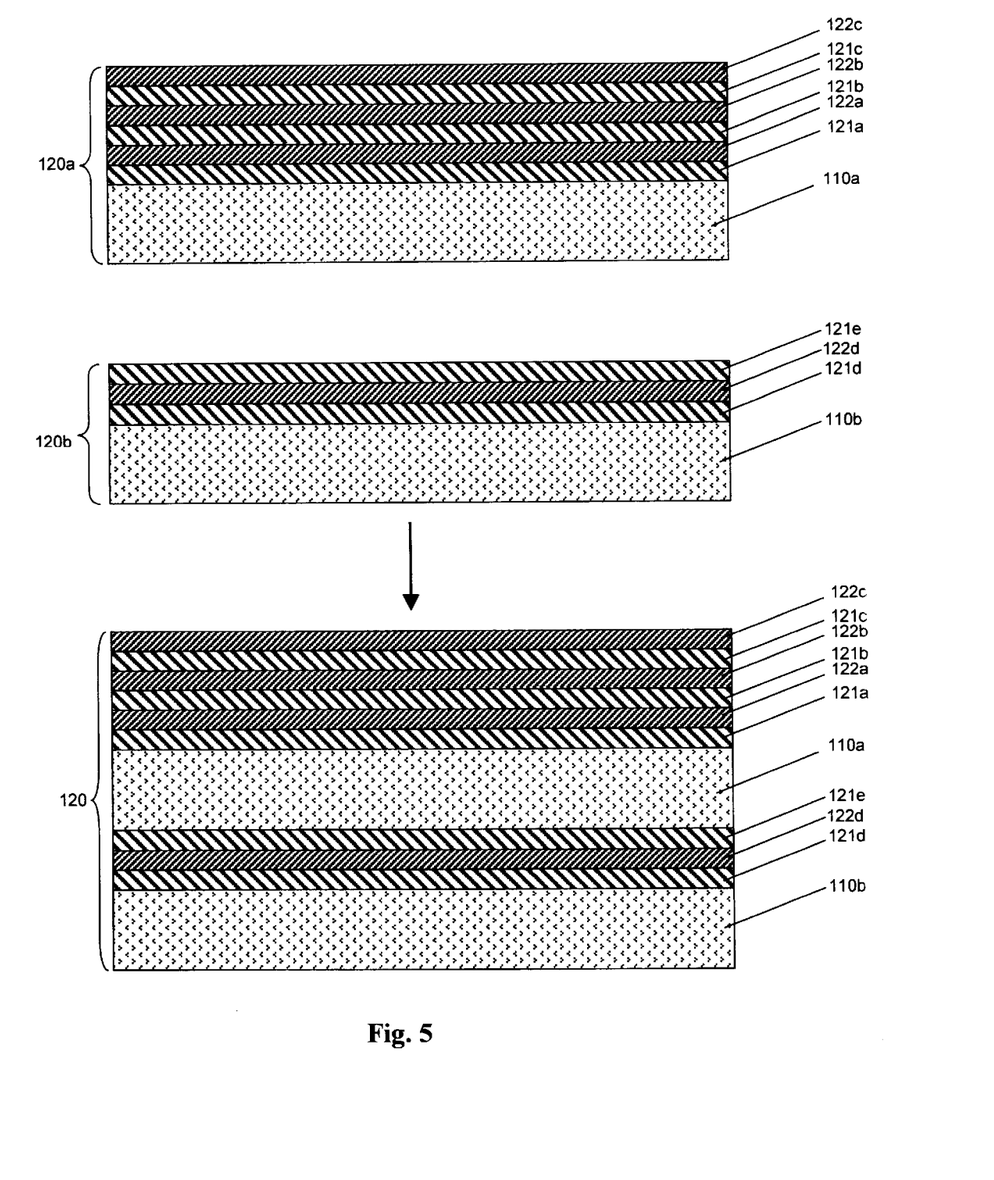
FIG. 5 is a cross-sectional view illustrating how a barrier region can be formed from two composite layer stacks, according to another embodiment of the invention.

While the above embodiments result in barrier regions having polymer substrate layers on the exterior surfaces after assembly of the composite layer stacks, other embodiments are possible. Referring, for example, to FIG. 5, the barrier region 120 is formed from the same pair of composite layer stacks 120a, 120b that is used to form the barrier region 120 in FIG. 2. However, in this instance, the barrier region 120a is flipped, such that the high-density layer 122c is exposed after assembly, rather than polymer substrate layer 110a.

The barrier regions of the present invention are useful in connection with a number of optoelectronic devices, including circuits, such as organic light emitting diodes, organic electrochromic displays, organic photovoltaic devices and organic thin film transistors. Hence, although the specific examples given below are directed to OLEDs, such barrier regions can be used with other devices besides OLEDs.

Figure 6:
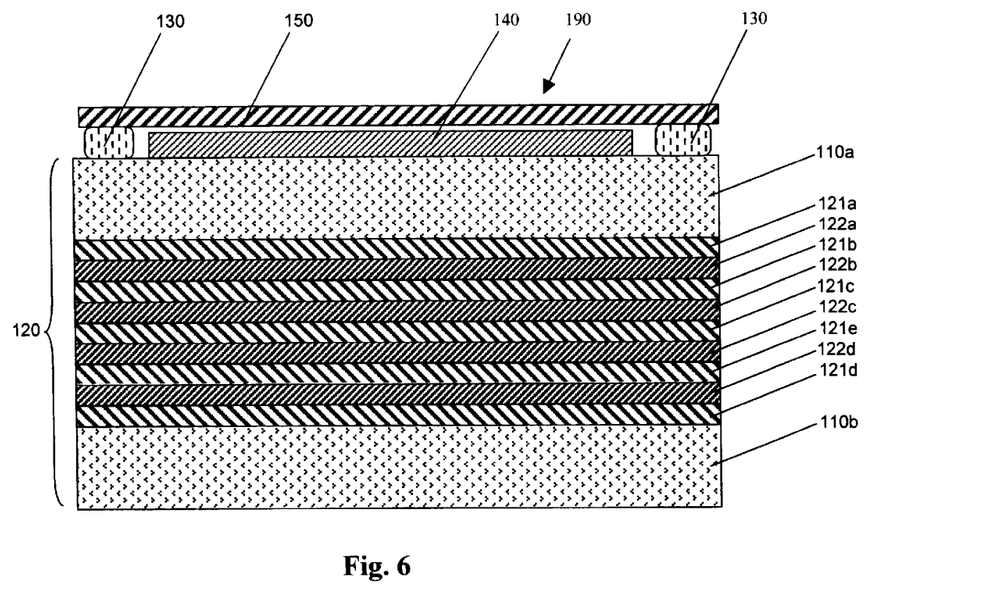
FIG. 6 is a cross-sectional view of an OLED structure that utilizes the barrier region of FIG. 1, according to an embodiment of the invention.

Reference is now made to FIG. 6, which illustrates an OLED structure 190 in which an OLED 140 is disposed on a barrier region 120 like that of FIG. 1. To protect the OLED 140 from the surrounding environment, an additional barrier region 150 is secured to the barrier region 120 by adhesive region 130. Preferably, the second barrier layer 150 is not in contact with the OLED 140 as shown.

The adhesive region 130 is selected to provide a good bond between the barrier region 120 and the additional barrier region 150, and to provide a barrier to moisture and oxygen, without damaging the OLED during curing (e.g., due to off-gassing). Preferred materials for these purposes include ultraviolet-curable and thermally curable epoxy materials. Preferred epoxy materials are ultraviolet curable, single-part epoxies such as Epotek OG159. The thickness of the adhesive region typically ranges from 25 to 100 microns.

Although not necessarily immediately apparent from the two-dimensional rendering of FIG. 1, the adhesive region 130 typically surrounds the OLED 140, having an appearance somewhat like that of a gasket occupying the space between polymer substrate layer 110a of barrier region 120 and the additional barrier region 150. As a result, in the embodiment shown, adhesive region 130 cooperates with the barrier region 120 and the additional barrier region 150 to isolate the OLED from the outside environment.

Figure 7:
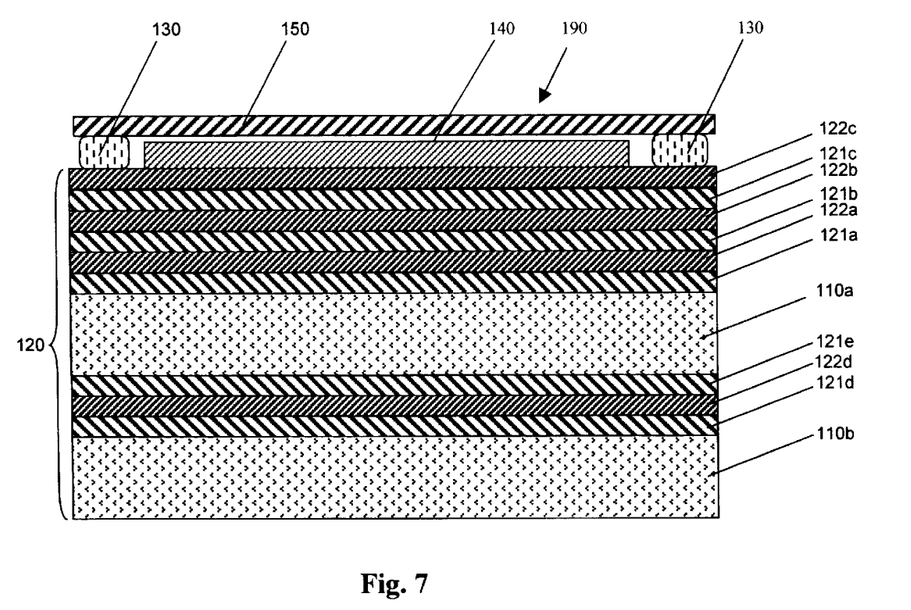
FIG. 7 is a cross-sectional view of an OLED structure that utilizes the barrier region of FIG. 5, according to an embodiment of the invention.

In the embodiment shown, a polymer substrate layer 110a is positioned adjacent the OLED 140 and adhesive region 130. In other embodiments, the barrier region 120 is constructed such that one of the cooperative barrier regions (i.e., the regions of planarizing and high-density layers) is provided in contact with the OLED and adhesive region, rather than the polymer substrate layer. For example, FIG. 7 illustrates an embodiment of the invention in which the barrier region of FIG. 5 is used to construct an OLED structure 190. In this embodiment, a high-density layer 122c is provided in contact with the OLED 140 and adhesive region 130. However, such embodiments may be less preferred in some instances in that attachment of the additional barrier region opposite the OLED (e.g., metal can, etc.) can ultimately result in a substantial amount of stress being exerted upon the interface between the polymer substrate layer and the cooperative barrier layer region. Unfortunately, the bond between the polymer substrate layer and the cooperative barrier layer region is frequently relatively weak. Consequently, the resulting structure may not be particularly robust, with separation of the cooperative barrier layer region from the polymer substrate layer being possible. In addition, this configuration is believed to result in a decrease in barrier effectiveness during anode processing in some instances.

Preferred materials for the additional barrier layer 150 will vary from application to application and include metals, silicon wafers, ceramics and low-permeability polymers.

Metals offer excellent barrier properties, and can be provided in a number of configurations, such as in the form of a metal can and or metal foil, with metal foils being preferred due to ease of manufacture. Preferred metal foils include aluminum, gold, nickel, nickel alloy and indium, as well as other foils known in the art.

Ceramics also offer low permeability and provide transparency in many cases. Preferred ceramics are glasses, more preferably more preferably soda lime and borosilicate glasses.

Polymers are often preferred where optical transparency is desired and/or where ease of continuous manufacture (e.g., web-based manufacture) is desired. Preferred low permeability polymers include polyesters, polyethersulphones, polyimides and fluorocarbon polymers as well as polymer-containing composite structures containing a series of cooperative barrier layers, such as those discussed in connection with the barrier layer 120.

The OLED 140 can be any OLED known in the art. For example, as noted above, the OLED will generally comprise an anode layer (typically transparent), a cathode layer, and a light-emitting layer (emission layer) disposed between the anode and cathode layer. The light emitting layer can be provided in connection with a number of configurations, including the following: (a) a three-layer configuration comprising a hole transporting layer, an emission layer and an electron transporting layer (i.e., a double heterostructure configuration), (b) a two-layer configuration comprising a hole transporting layer and a layer that provides both emission and electron transporting functions (i.e., a single heterostructure configuration) and (c) a configuration comprising a single layer that provides hole transporting, electron transporting and emission functions (i.e., a single layer configuration). In each configuration, additional layers may also be present, for example, layers that enhance hole injection or electron injection, or layers that serve to block holes or electrons. Several structures for such devices are discussed, for example, in U.S. Pat. No. 5,707,745, the entire disclosure of which is hereby incorporated by reference. Other more complex OLED architecture is also practiced in the art.

In some embodiments of the invention, a gettering material (not shown) is placed proximate the OLED 140. The gettering material acts to capture any moisture, oxygen, etc. that may reach the interior of the device 190 and harm the OLED 140. Preferred gettering materials include CaO and BaO. One particularly preferred product is HICAP2000, a CaO paste obtainable from Cookson SPM.

Figure 8:
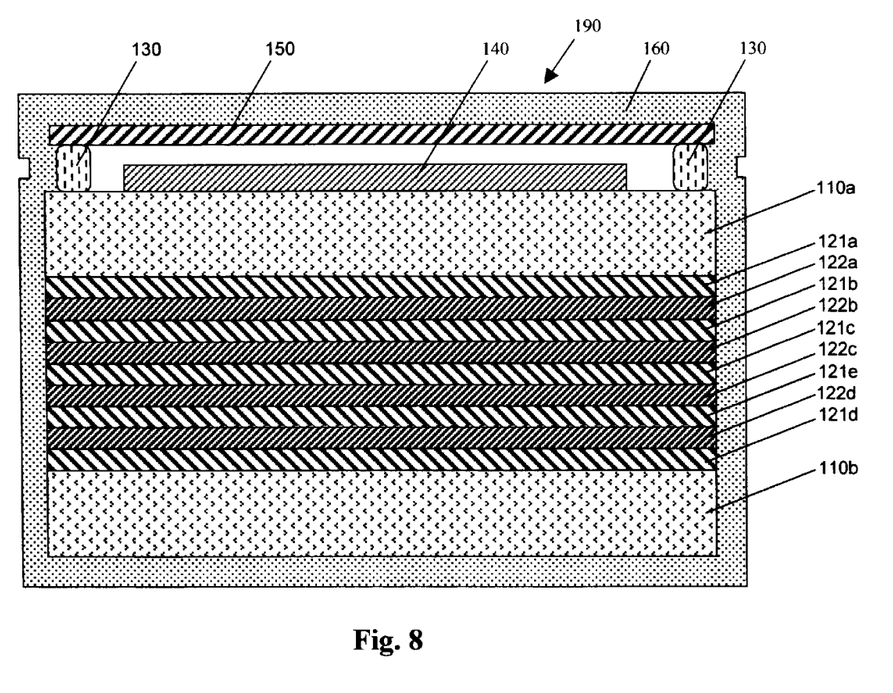
FIG. 8 is a cross-sectional view of the OLED structure of FIG. 6, upon being provided with an. encapsulating barrier layer, according to an embodiment of the invention.
Figure 9:
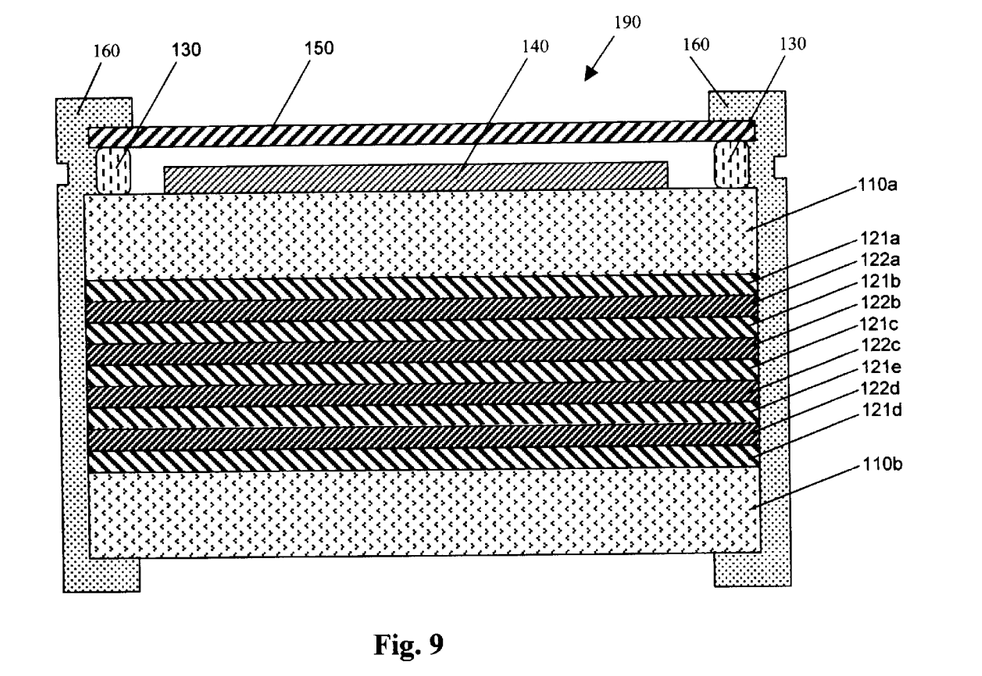
FIG. 9 is a cross-sectional view of the OLED structure of FIG. 6, upon being provided with an edge barrier layer, according to an embodiment of the invention.

Depending on the circumstances, lateral diffusion of harmful species in the outside environment can occur. One way of addressing lateral diffusion is illustrated in FIG. 8, in which an encapsulating region 160 surrounds the entire OLED structure 190 of FIG. 6, which region acts as a further barrier region. In FIG. 9, which illustrates another embodiment of the invention, only the edges of an OLED structure 190 like that of FIG. 6 are surrounded by the encapsulating region 160, which region acts as an edge barrier to lateral diffusion. In accordance with another embodiment of the invention (not shown), the edges of the barrier region 120 are provided with an edge barrier prior to incorporation into the device structure 190.

Figure 10:
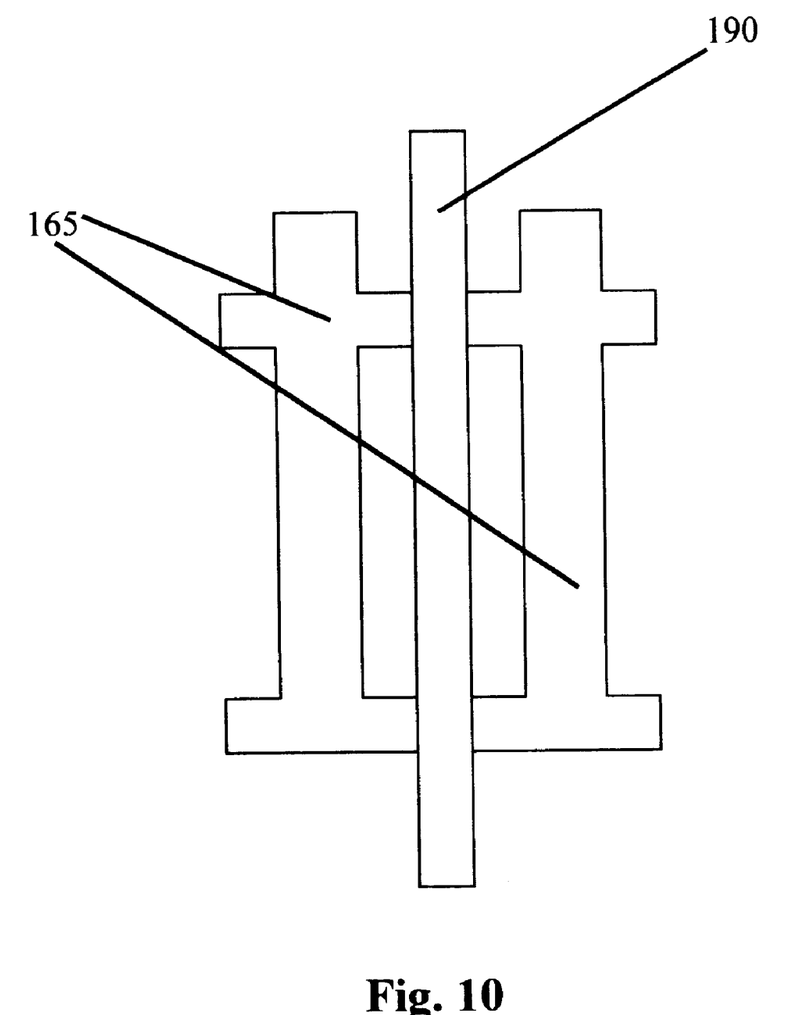
FIG. 10 is a schematic diagram of an OLED structure being held by a rotatable chuck, according to an embodiment of the invention.

The preferred materials for the encapsulating regions 160 of FIG. 8 and FIG. 9 are epoxies. More preferred are ultraviolet-curable epoxy materials having viscosities that are sufficiently low to flow smoothly and form an optically clear surface. Preferably, the refractive index of the encapsulation region 160 is as precisely matched to the refractive index of the substrate 110 as is possible. Preferred techniques for applying the encapsulating region 160 include dipping, pouring and spin coating.

Where only the edges of the OLED structure 190 (or barrier region 120) are to be provided with the encapsulating region 160, the OLED structure 190 can be held within a rotatable chuck 165 as shown in FIG. 10. As the chuck 165 is rotated, the OLED structure 190 is dipped into a suitable material in liquid form (for example, into the above epoxies, or liquid polyimide or fluorocarbon formulations), after which the material in liquid form is cured. Other alternatives are also possible such as spraying with a suitable material while rotating the chuck.

In yet other embodiments, the OLED structure 190 (or barrier region 120), along with any chuck or other holder, is inserted into a vacuum chamber, whereupon a high-density material (such as those discussed above) or other appropriate material is applied, for example, by sputtering, by electron-beam techniques, or by any other known techniques for depositing a layer under vacuum.

Depending on the material used for the polymer substrate layers, chemical species can be released from the substrate layers. Hence, the substrates used in connection with the practice of the present invention are preferably degassed by heating under vacuum prior to their use. This is of enhanced importance for polymer substrate layers disposed adjacent the optoelectronic device (see, for example, FIG. 8 and FIG. 9, in which the polymer substrate layer 110*a* is adjacent the OLED 140).

Although the present invention has been described with respect to several exemplary embodiments, there are many other variations of the aboved described embodiments that will be apparent to those of ordinary skill in the art. It is understood that these variations are within the teachings of the present invention, and that the invention is to be limited only by the claims appended hereto.

What is claimed is:

1. An organic optoelectronic device structure comprising:
   a first barrier region comprising a first composite layer stack and a second composite layer stack attached to said first composite layer stack, said first composite layer stack comprising a first polymer substrate layer, a first planarizing layer and a first high-density layer, and said second composite layer stack comprising a second polymer substrate layer, a second planarizing layer and a second high-density layer;
   an additional barrier region; and
   an organic optoelectronic device selected from an organic light emitting diode, an organic electrochromic display, an organic photovoltaic device and an organic thin film transistor disposed between said first barrier region and said additional barrier region, wherein said additional barrier region cooperates with said first barrier region to restrict transmission of water and oxygen to said optoelectronic device from an outer environment.

2. The organic optoelectronic device structure of claim 1, wherein said first and second polymer substrate layers are of the same material composition.

3. The organic optoelectronic device structure of claim 1, wherein said first and second polymer substrate layers are of different material compositions.

4. The organic optoelectronic device structure of claim 1, wherein said first composite stack and said second composite stack are attached to one another via one of said first and second planarizing layers.

5. The organic optoelectronic device structure of claim 1, further comprising an adhesive layer between said first and second composite stacks.

6. The organic optoelectronic device structure of claim 1, wherein said first planarizing layer, said first high-density layer, said second planarizing layer and said second high-density layer are disposed between said first polymer substrate layer and said second polymer substrate layer.

7. The organic optoelectronic device structure of claim 1, wherein (i) said first planarizing layer and said first high-density layer are disposed over said first polymer substrate layer, (ii) said second polymer substrate layer is disposed over said first planarizing layer and said first high-density layer, and (iii) said second planarizing layer and second high-density layer are disposed over said second polymer substrate layer.

8. The organic optoelectronic device structure of claim 1, wherein said first composite layer stack, said second composite layer stack or both said first and second composite layer stacks comprise two or more planarizing layers and two or more high-density layers.

9. The organic optoelectronic device structure of claim 1, wherein said first composite layer stack, said second composite layer stack or both said first and second composite layer stacks comprise an alternating series of two or more planarizing layers and two or more high-density layers.

10. An OLED structure comprising:
   a first barrier region comprising a first composite layer stack and a second composite layer stack attached to said first composite layer stack, said first composite layer stack comprising a first polymer substrate layer, a first planarizing layer and a first high-density layer, and said second composite layer stack comprising a second polymer substrate layer, a second planarizing layer and a second high-density layer;
   an additional barrier region; and
   an OLED disposed between said first barrier region and said additional barrier region, wherein said additional barrier region cooperates with said first barrier region to restrict transmission of water and oxygen from an outer environment to said optoelectronic device.

11. The OLED structure of claim 10, wherein said first and second polymer substrate layers are of the same material composition.

12. The OLED structure of claim 10, wherein said first and second polymer substrate layers are of different material compositions.

13. The OLED structure of claim 10, wherein said first and second high-density layers are of the same material composition.

14. The OLED structure of claim 10, wherein said first and second high-density layers are of different material compositions.

15. The OLED structure of claim 10, wherein said first and second planarizing layers are of the same material composition.

16. The OLED structure of claim 10, wherein said first and second planarizing layers are of different material compositions.

17. The OLED structure of claim 10, wherein said first composite stack and said second composite stack are attached to one another via one of said first and second planarizing layers.

18. The OLED structure of claim 10, further comprising an adhesive layer between said first and second composite stacks.

19. The OLED structure of claim 10, wherein said first planarizing layer, said first high-density layer, said second planarizing layer and said second high-density layer are disposed between said first polymer substrate layer and said second polymer substrate layer.

20. The OLED structure of claim 10, wherein (i) said first planarizing layer and said first high-density layer are disposed over said first polymer substrate layer, (ii) said second polymer substrate layer is disposed over said first planarizing layer and said first high-density layer, and (iii) said second planarizing layer and said second high-density layer are disposed over said second polymer substrate layer.

21. The OLED structure of claim 10, wherein said first composite layer stack comprises two or more first planarizing layers and two or more first high-density layers.

22. The OLED structure of claim 21, wherein said second composite layer stack comprises two or more second planarizing layers and two or more second high-density layers.

23. The OLED structure of claim 10, wherein said first composite layer stack comprises an alternating series of two or more first planarizing layers and two or more first high-density layers.

24. The OLED structure of claim 23, wherein said second composite layer stack comprises an alternating series of two or more second planarizing layers and two or more second high-density layers.

25. The OLED structure of claim 10, wherein said first barrier region further comprises a third composite layer stack attached to said second composite layer stack, said third composite layer stack comprising a third polymer substrate layer, a third planarizing layer and a third high-density layer.

26. The OLED structure of claim 10, wherein said first planarizing layer and said second planarizing layer comprise a material selected from fluorinated polymers, parylenes, cyclotenes and polyacrylates.

27. The OLED structure of claim 10, wherein said first high-density layer and said second high-density layer comprise a material selected from metal oxides, metal nitrides, metal carbides and metal oxynitrides.

28. The OLED structure of claim 10, wherein said first high-density layer and said second high-density layer comprise a material selected from silicon oxide, silicon nitride, aluminum oxide, indium tin oxide and zinc indium tin oxide.

29. The OLED structure of claim 10, wherein said first and second polymer substrate layers comprise a material selected from a fluorocarbon polymer, a polyethersulphone, a polyimide, a polyolefin, and a polyester.

30. The OLED structure of claim 29, wherein said first polymer substrate layer comprises a polyolefin and said second polymer substrate layer comprises a polyester.

31. The OLED structure of claim 30, wherein said first polymer substrate layer comprises a cyclic olefin copolymer and said second polymer substrate layer comprises a polyethylene terephthalate.

32. A method of forming an organic optoelectronic device structure comprising:
   providing a first composite layer stack, said first composite layer stack comprising a first polymer substrate layer, a first planarizing layer and a first high-density layer,
   providing a second composite layer stack, said second composite layer stack comprising a second polymer substrate layer, a second planarizing layer and a second high-density layer;
   attaching said first composite layer stack to said second composite layer stack to form a first barrier region;
   providing an organic optoelectronic device selected from an organic light emitting diode, an organic electrochromic display, an organic photovoltaic device and an organic thin film transistor; and
   disposing said organic optoelectronic device between said first barrier region and an additional barrier region, such that said additional barrier region cooperates with said first barrier region to restrict transmission of water and oxygen to said optoelectronic device from an outer environment.

33. The method of claim 32, wherein said first and second polymer substrate layers are of the same material composition.

34. The method of claim 32, wherein said first and second polymer substrate layers are of different material compositions.

35. The method of claim 32, wherein said first composite stack and said second composite stack are attached to one another via one of said first and second planarizing layers.

36. The method of claim 32, wherein said first composite stack and said second composite stack are attached to one another via an adhesive layer.

37. The method of claim 32, wherein said first composite layer stack is attached to said second composite layer stack such that said first planarizing layer, said first high-density layer, said second planarizing layer and said second high-density layer are all disposed between said first and second polymer substrate layers.

38. The method of claim 32, wherein (i) said first planarizing layer and said first high-density layer are disposed over said first polymer substrate layer, (ii) said second polymer substrate layer is disposed over said first planarizing layer and said first high-density layer, and (iii) said second planarizing layer and said second high-density layer are disposed over said second polymer substrate layer.

39. The method of claim 32, wherein said first composite layer stack, said second composite layer stack, or both said first and second composite layer stacks comprise two or more planarizing layers and two or more high-density layers.

40. The method of claim 32, wherein said first composite layer stack, said second composite layer stack or both said first and second composite layer stacks comprise an alternating series of two or more planarizing layers and two or more high-density layers.

41. The method of claim 32, wherein said organic optoelectronic device is an OLED.

42. The method of claim 32,
   wherein said first composite layer stack is provided by a method comprising: providing said first polymer substrate layer, and depositing said first planarizing layer and said first high-density layer over said first polymer substrate, and
   wherein said second composite layer stack is provided by a method comprising: providing said second polymer substrate layer, and depositing said second planarizing layer and said second high-density layer over said second polymer substrate layer.

* * * * *